United States Patent
Yang et al.

(10) Patent No.: US 6,239,034 B1
(45) Date of Patent: May 29, 2001

(54) METHOD OF MANUFACTURING INTER-METAL DIELECTRIC LAYERS FOR SEMICONDUCTOR DEVICES

(75) Inventors: Fu-Liang Yang, Tainan; Liang-Tung Chang, Hsinchu, both of (TW)

(73) Assignee: Vanguard International Semiconductor Corporation, Hsin-chu (TW)

( * ) Notice: Subject to any disclaimer, the term of this patent is extended or adjusted under 35 U.S.C. 154(b) by 0 days.

(21) Appl. No.: 09/184,344

(22) Filed: Nov. 2, 1998

(51) Int. Cl.$^7$ .................................................. H01L 21/311
(52) U.S. Cl. .......................... 438/697; 438/706; 438/723
(58) Field of Search .................................... 438/624, 623, 438/631, 632, 697, 700, 706, 712, 723, 743, 622, 750

(56) References Cited

U.S. PATENT DOCUMENTS

| | | | |
|---|---|---|---|
| 5,110,763 | * 5/1992 | Matsumoto | 438/699 |
| 5,332,694 | * 7/1994 | Suzuki | 438/624 |
| 5,426,076 | 6/1995 | Moghadam | 437/238 |
| 5,459,105 | 10/1995 | Matsuura | 437/228 |
| 5,482,900 | 1/1996 | Yang | 437/228 |
| 5,798,298 | * 8/1998 | Yang et al. | 438/622 |
| 5,883,001 | * 3/1999 | Jin et al. | 438/624 |
| 5,960,321 | * 9/1999 | Hsieh et al. | 438/700 |

OTHER PUBLICATIONS

"Accuglass T–11 Series Spin–On Glass (SOG)" Allied Signal, Inc. Advance Microelectronics Materials, 3500 Garrett Dr. Santa Clara, CA, 9554–2827.

* cited by examiner

Primary Examiner—Benjamin L. Utech
Assistant Examiner—Duy-Vu Deo
(74) Attorney, Agent, or Firm—George O. Saile; Stephen B. Ackerman; William J. Staffel

(57) ABSTRACT

A method of manufacturing an inter-metal level dielectric layer for a semiconductor device. The method includes forming spaced conductive lines. Next, a first conformal silicon oxide film (barrier layer) is formed over the spaced conductive lines. Gaps or valleys are between the metal lines covered by the barrier layer. A novel first "gap filling" spin-on-glass layer is formed over the first silicon oxide layer. In a critical step, the first SOG layer is heated to reflow thereby flowing all the first spin-on-glass layer from over the metal lines and leaving all of the first SOG layer in the gaps. Subsequently, a second silicon oxide layer is deposited over the first silicon oxide layer and over the first spin-on-glass layer only in the gaps. A second spin-on-glass layer is then formed over the second silicon oxide layer. An etchback is performed by etching back and removing the entire second spin on glass layer and portions the second silicon oxide layer. Lastly, an insulating cap layer of silicon oxide or silicon nitride is formed over the second silicon oxide layer.

19 Claims, 3 Drawing Sheets

METHOD OF MANUFACTURING INTER-METAL DIELECTRIC LAYERS FOR SEMICONDUCTOR DEVICES

BACKGROUND OF INVENTION

1) Field of the Invention

This invention relates generally to the fabrication of dielectric layers for semiconductor devices and more particularly to a method for forming an inter-metal dielectric (IMD) layers using spin-on-glass (SOG) for sub-half-micron semiconductor devices.

2) Description of the Prior Art

Semiconductor elements are continuously being miniaturized in order to make circuits smaller, faster, and less expensive. However this miniaturization creates may challenges. High quality dielectric layers between conductive lines in semiconductor devices is a critical necessity for the submicron feature sized era in the manufacture of integrated circuits. These high quality dielectric layers are required over conductive lines, such as polysilicon gates on the substrate surface (e.g., interlevel dielectric) and such as metal lines over the substrate (e.g. interlevel dielectric). VLSI devices require miniaturization of interconnects, etc., interconnection spaces, resulting in increase in steps formed on the surface of a substrate. This is a particular problem when spacing between conductive lines is less than 0.15 $\mu$m.

The manufacturing requirements of intermetal dielectric layers in sub-half micron semiconductor devices include: (1) voidless fill of narrow trenches (gaps) between conductors (metal lines), (2) surface being planar for successful patterning and etching of the new blanket metal deposition, (3) stable with respect to water transport and (4) exhibiting a net compressive stress.

Practitioners have improved planarization methods. For example, U.S. Pat. No. 5,459,105 (Matsumura) describes a planarization method for IMD using PESiO2, O3-TEOS, SOG, etchback and PESiO2. Also, U.S. Pat. No. 5,482,900 (Yang) and U.S. Pat. No. 5,426,076 (Moghadan) show planarization methods. Product literature from Allied Signal Inc, Advance microelectronics materials, 3500 Garrett Drive, Santa Clara Calif. 9554-2827 (phone 408-562-0330), describe Accuspin® 418 Flowable SOP (X-18), and Accuglass T-11 Series SOG-(111, 211, 211).

However these methods can be further improved to meet the above mentioned requirements and overcome the above mentioned shortcomings.

SUMMARY OF THE INVENTION

It is an object of the present invention to provide a method for fabricating an intermetal dielectric layer that includes spin-on-glass layers that fill gaps less than 0.15 $\mu$m between conductive lines and eliminates the poison via problem.

It is an object of the present invention to provide a method for fabricating an intermetal dielectric layer that allows the use of thick barrier layers over metal lines while filling gaps less than 0.15 $\mu$m and maintains a low dielectric constant to improve RC delay.

It is an object of the present invention to provide a method for fabrication an intermetal dielectric layer that includes an improved SOG process that provides superior gap filling properties as well as maintains a low dielectric constant.

To accomplish the above objectives, the present invention provides a method of manufacturing an interlevel dielectric layer for a semiconductor device. The method comprises forming spaced conductive lines 14 over a semiconductor structure including a substrate. Next, a first conformal silicon oxide layer is formed by PECVD-SiH$_4$ over the spaced conductive lines and over the semiconductor structure. The spaced conductive lines 14 coated with the barrier layer 16 having gaps 15 therebetween.

In an important step, a novel first spin-on-glass (SOG) layer 18 is formed over the first silicon oxide layer. It is critical that the invention's first spin-on-glass has a superior gap filling coverage and has the reflow property as heated at proper temperatures. After the reflow process, it is critical that the first SOG layer 18 does not remain over the metal lines but fills the valleys 15 between the metal lines. See FIGS. 1 and 5B. A reflow is performed by heating the first spin-on-glass layer so that all of first SOG layer 18 over the spaced metal lines 16 flows in to the gaps between the metal lines.

Subsequently, a second silicon oxide layer 24 is preferably deposited using a plasma enhanced chemical vapor deposition (PECVD)-SiH$_4$ process over the first silicon oxide layer 16 and over the first spin-on-glass layer 18 in the gaps 15. A second spin-on-glass layer 28 ("Planarizing" SOG) is then formed over the second silicon oxide layer 24. An etchback is performed by etching back and removing the entire second spin on glass layer and portions the second silicon oxide layer. Lastly, an insulating cap layer 30 is formed over the second silicon oxide layer. The insulating cap layer formed of silicon oxide and silicon nitride.

The invention has the following key features:

A key feature of the invention is the novel 1st SOG layer 18 that has reflow properties so that the SOG fills gaps between metal lines >0.15 $\mu$m. Only traces of or No 1st SOG layer 18 remains above the metal lines 15 after reflow. See FIG. 1.

The Invention's 1st SOG layer 18 is a new use specifically for Allied Signal Accuspin 418 SOP and HSG-2209S-R7 organic spin-on-glasses.

The first 18 and second SOG layers 28 have different coating functions and properties. The first SOG layer fills tight (>or equal to 0.1 $\mu$m) gaps 15 in between the metal lines 14, and does not remain on top of the metal lines 14. The second SOG layer is a "planarizing "sacrificial layer for etch back planarization. The second SOG layer does not have the reflow property of the first SOG layer.

The second SOG layer 28 is removed in an etched back to planarized the underlying SiO$_2$ layer 24.

The present invention provides an improved interlevel (or intermetal) dielectric layer. The present invention provides an intermetal dielectric layer 16 18 24 30 that allows the use of thick barrier layers 16 over metal lines 14 while filling gaps 15 less than 0.15 $\mu$m. The excellent gap filling properties of the novel first SOG layer 18 allow the gaps to be filled without thinning the barrier layers 16. The first SOG layer 18 maintains a low dielectric constant to improve RC delay. Moreover, by removing the entire 2nd spin-on-glass layer 28 over the via, the poison via problem is eliminated.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
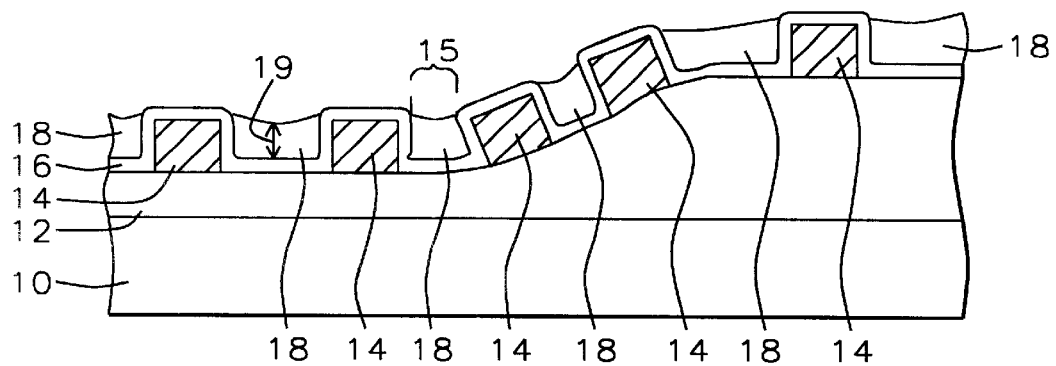
FIGS. 1 through 4 are cross sectional views for illustrating a method for manufacturing the interlevel dielectric layer for a semiconductor device according to the present invention.

The present invention will be described in detail with reference to the accompanying drawings. The present invention provides a method of forming interlevel dielectric layer that provides: good gap coverage at gap 15 spaces at 0.10 $\mu$m and wider, low dielectric constant, eliminates the poison via problem and is simple to manufacture.

The process of the invention is summarized in the table below:

TABLE

Summary of the Process of the invention

| Fig | Step |
|---|---|
| 1 | form spaced metal lines 14 over a substrate |
| 1 | form a first conformal Silicon oxide layer 16 (Barrier layer) PE-SIH4 - 2000Å |
| 1 | KEY STEP form a first SOG (e.g., Aligned signal 218) 1900Å - that fills in valleys 15 between metal lines 14 but does not leave much thickness on the top of the metal lines.) |
| 1 | reflow (heat & cure) the first SOG layer 18 (GAP FILLING SOG)<br>♦ reflow process does not leave any of the 1st SOG layer over the top to the metal line<br>and a thickness 17 in the gaps between the metal lines 14 in a range of between about 1000 and 3000 Å |
| 2 | form a second oxide layer 24 (PE-SiH$_4$ 7000Å) over the 1st SOG layer 18 and the first conformal Silicon oxide layer 16 |
| 2 | form a second SOG layer 28 (e.g., allied signal 211–2000Å) (Planarizing SOG) |
| 2 | cure the second SOG layer 28 at 430° C. 30 min |
| 3 | etch back the second SOG layer (5000Å) |
| 4 | form an insulating cap layer (SiO$_2$ or SiN) |

As shown in FIG. 1, a semiconductor structure 12 10 is provided. The semiconductor structure 10 12 includes a semiconductor substrate 10 on and in which various semiconductor devices are formed, such as source, drains, gate electrodes, transistors, capacitors, bits lines, conductive lines, dielectric layers, etc. Layers 10 12 shown in the figures include (but not show) all possible semiconductor devices formed under conductive layers, such as FETs, capacitors, insulating and conducting layers.

Spaced conductive lines 14 (e.g., patterns, Al metal lines) formed over the semiconductor structure 12 including a substrate 10. The spaced conductive lines 14 are preferably Al alloy metal lines. Metal lines composed of Al alloy have strict barrier layer 16 thickness requirements that drive small gap (about 0.1 to 0.2 $\mu$m gaps) that require the used of the invention's novel 1st SOG layer 18.

Next, a first conformal silicon oxide layer (barrier layer) 16 is formed over the spaced conductive lines and over the semiconductor structure. The first conformal silicon oxide layer does not fill or close any gaps beneath the spaced conductive lines 14. The first silicon oxide layer 16 can be formed by a PECVD-SiH$_4$, or TEOS process. The first silicon oxide layer 16 preferably has a thickness in a range of between about 500 and 2000 Å.

The spaced conductive lines 14 (covered with a barrier layer 16) have gaps 15 (i.e., valleys) therebetween. The gaps 15 represent the space (valleys) between the barrier layer surfaces 16. The narrowest gaps 15 (on the substrate) preferably have a width greater than 0.10 and more preferably greater than 0.15 $\mu$m and preferably have a narrow gap widths 15 between about 0.15 $\mu$m and 0.5 $\mu$m. The gap widths can vary across the substrate and there is no maximum width. It can be seen in the Figs that the gaps 15 are smaller than the actual spacing between the metal lines 14 by 2 times the thickness of the barrier layer 16.

In an important step, a novel first spin-on-glass (SOG) layer is formed over the first silicon oxide layer 16. It is critical that the first SOG layer must have the property of reflowing when heated so that the first SOG layer does not remain over the metal lines 14 where the gap 15 between the metal lines/barrier layers 16 is greater than 0.10 $\mu$m and more preferably greater than 0.15 $\mu$m is more preferably between 0.15 and 0.30 $\mu$M. The first spin of glass is preferably composed a material selected from the group consisting of: Hitachi Chemical HSG-2209S-R7 (Hitachi Chemical, LTD., Shinjuku-Mitsui Bldg., 2-1-1, Nishi-shinjuku, Shinjuku-ku, Tokyo, 163-0449, Japan ), Allied Signal type 218 spin-on-glass and Allied Signal ACCUSPIN X18 spin-on-glass. (Allied Signal inc., Advanced Microelectronics Material, 3500 Garrett Drive, Santa Clara, Calif. 95054-2827, US phone 408-562-0300).

The 1st SOG layer preferably has the following solute parameters that give the require 0.15 $\mu$m gap fill properties: Viscosity between about 2.80 and 2.9 cP (25° C.), % solids between 20 and 22% (130° C., 4 hrs), Flash point=59 and 61° F. (based on ethanol).

The first spin-on-glass layer is preferably reflowed (baked & cured) at temperature in a range of about 400 and 450° C. (tgt=430° C.) for a time in a range of about 10 and 200 minutes and more preferably between about 20 and 40 minutes (tgt=30 min). Specifically for Allied Signal Inc., ACCUSPIN® 418 Flowable SOP, the inventors have found that it fills gaps down to 0.1 $\mu$m. This contrasts with Allied Signal's published statement that ACCUSPIN 418® Flowable SOP fills 0.15 $\mu$m gaps. The invention's method is a new use for Accuspin 418 Flowable SOP.

The invention's 1st SOG is not etched back, in contrast conventional processes, to remove the SOG layer from over the metal lines 14. This increases yield be not subjecting the metal lines 14 to plasma damage from etchback processes.

Figure 5A:
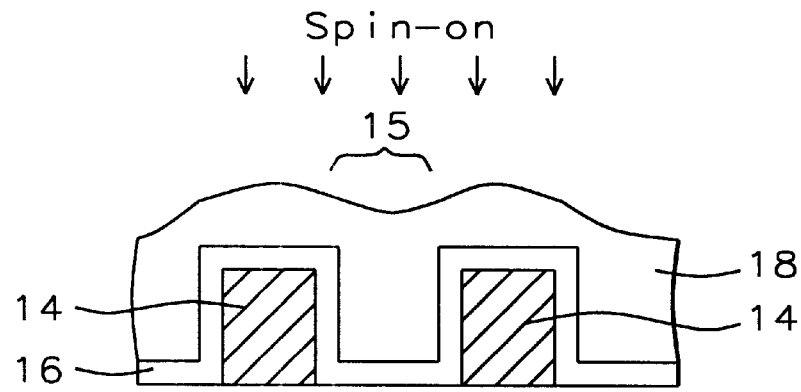
FIG. 5A shows a SOG layer as spun on the structure before reflow.
Figure 5B:
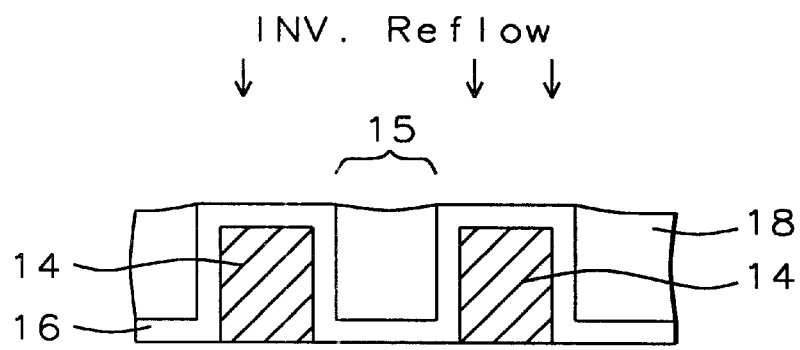
FIG. 5B shows the effect of reflow (heating) the invention's superior gap fill 1st SOG layer 18. All the SOG 18 flows from over the metal lines 14 into the gaps 15.
Figure 5C:
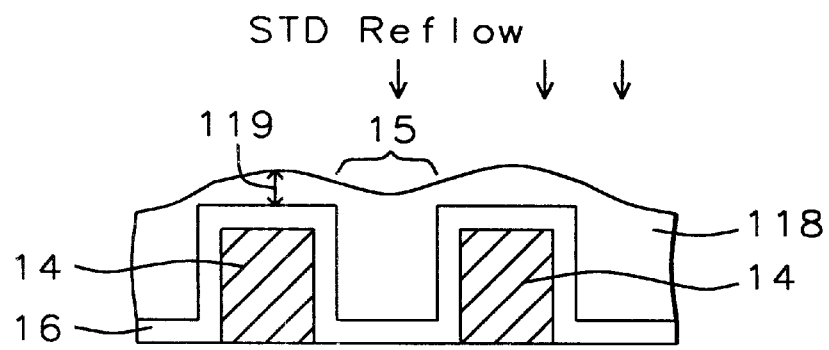
FIG. 5C shows conventional SOG 118 that reflows but still has a portion of SOG remaining over the metal lines 14.

FIGS. 5A, 5B and 5C show the differences between the invention's first SOG layer 18 and standard SOG 118. FIG. 5A shows metal lines 14 and the first conformal silicon oxide layer 16. The metal lines 14 have gaps 15 therebetween. FIG. 5A shows a SOG layer 118 as spun on the structure. Both standard SOG and the invention's superior gap filling SOG layer 18 have the shape after spin on as shown in FIG. 5A's SOG layer 18.

FIG. 5B shows the effect of reflow (heating) the invention's superior gap fill layer 18. All the SOG 18 flows from over the metal lines 14 into the gaps 15. In contrast, FIG. 5C shows conventional SOG 118 that reflows but still has a portion with at thickness 119 (>50 Å) remaining over the metal lines 14. A major difference between the invention and the prior art is that the invention specifies that the first SOG layer 18 have the superior gap fill property to flow into gaps 0.15 μm and larger and not have any thickness remain over the metal lines 14, (e.g., high points).

The first spin-on-glass layer can be formed by dispensing a first spin-on-glass solute preferably of Allied Signal type ACCUSPIN® 418 flowable SOP and type X18 spin-on-glass and spinning said first spin-on-glass solute at a speed in a range of about 2000 and 5000 rpm for a time in a range of about 0.5 and 3.0 min, and curing the first spin-on-glass solute at a temp in a range of about 150 and 300 C° for a time in a range of about 10 and 200 min. The first spin-on-glass layer preferably has a thickness in a range of between about 1000 and 3000 Å.

An optional wet or dry etch back can be performed to ensure all 1st SOG layer 18 (trace amounts with thickness between 1 and 50 Å) is removed from over metal lines.

Figure 2:
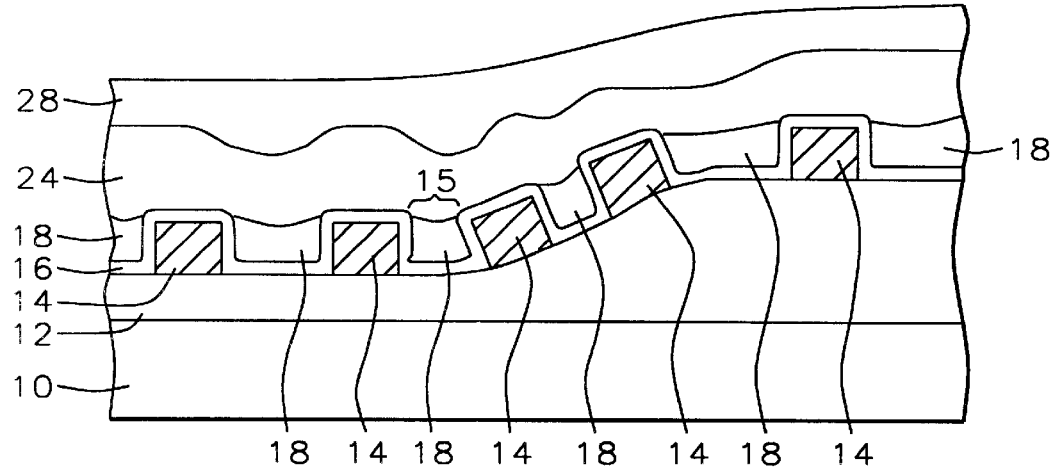

As seen in FIG. 2, a second silicon oxide layer 24 is deposited over the first silicon oxide layer and over the first spin-on-glass layer in the gaps. The second silicon oxide layer 24 can be formed using PECVD-SiH4, or TEOS process and is preferably formed using a PECVD-SiH4 process. The second silicon oxide layer preferably has a thickness in a range of between about 3000 and 10,000 Å (tgt=7000 Å).

Still referring to FIG. 2, a second spin-on-glass layer 28 is formed over the second silicon oxide layer. The second spin on-glass layer can be formed using a "planarizing SOG". A planarizing SOG layer does not fill gaps but forms a flat planar top surface. Examples of acceptable second SOG layers are: AlliedSignal's Accuglass®T-11 Series SOG, models 111, 211, or 311.

The second spin-on-glass layer can be optionally cured at temperature in a range of about 200 and 450° C. (tgt=430° C.) for a time in a range of about 10 and 200 minutes (tgt=30 min). The curing provides stability.

The second spin on glass layer preferably has a thickness in a range of between about 1000 and 5000 Å(tgt=2000 Å) and more preferably of about 2000 Å.

Figure 3:
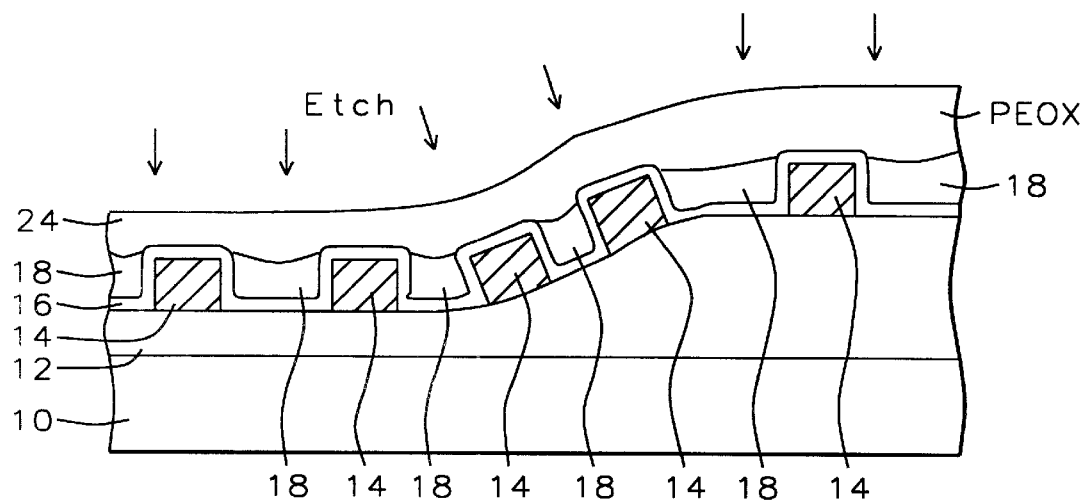

As shown in FIG. 3, an etchback is performed by etching back and removing all the second spin on glass layer 28 and portions the second silicon oxide layer 24 to remove a total thickness of about 1000 to 7000 Å(tgt.=5000 Å). The etch back is preferably a dry etch process, such as $CF_4$ or $CHF_3$.

Figure 4:
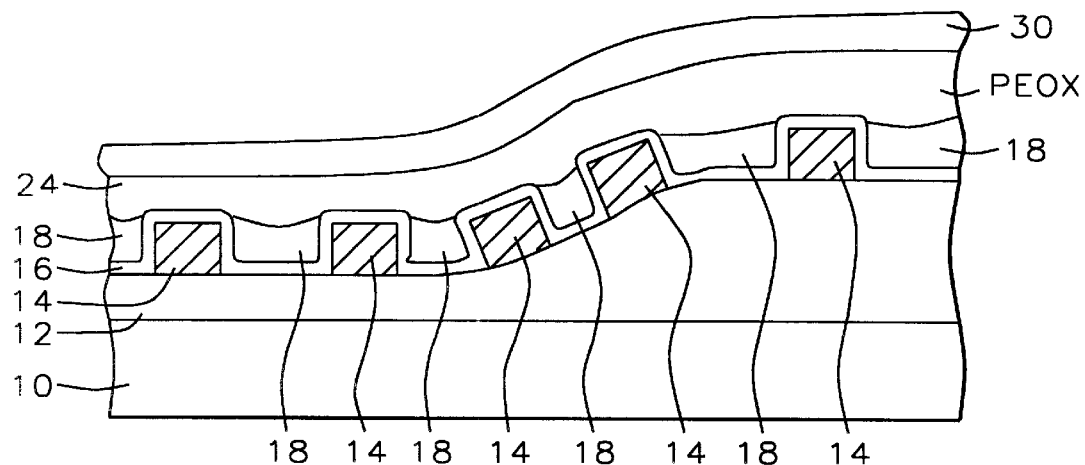

Still referring to FIG. 4, an insulating cap layer 30 is preferably formed over the second silicon oxide layer. The insulating cap layer is preferably formed of silicon oxide or silicon nitride (SiN). The insulating cap layer 30 preferably has a thickness in a range of about 1000 and 5000 Å and more preferably a thickness of about 3000 Å.

TABLE 1

Process Flow of the inter metal dielectric (IMD) layer of the present invention

| Layer | Material | Parameter | Low | target | High |
|---|---|---|---|---|---|
| 1st silicon oxide layer - PE-SiH4 | oxide | thickness (Å) | 500 Å | 2000 Å | 2000 |
| 1st SOG layer GAP FILL | Allied signal 218 | thickness (Å) | 1000 Å | 1900 Å | 2000 |
| | Hitachi HSG-2209S-R9 | thickness (Å) | 1000 Å | | 2000 Å |
| 1st SOG layer 18 curing | | temp | | at 430° C. for 30 min | |
| 2nd silicon oxide layer 24 PE-SiH$_4$ | | thickness (Å) | 3000 | 7000 Å | 10,000 |
| 2nd SOG layer 28 "planarizing" | Allied signal 211 | thickness (Å) | 1000 | 2000 | 3000 |
| SOG curing at T = 430° C. for ~30 minutes | | | | | |
| Etch back of SOG layer | SOG | thickness (Å) | 1000 | 3000 | 5000 |

Benefits of the Invention

Current conventional SOG planarization processes have not adequately filled gaps less than 0.15 μm (or 0.1 μm) between conductive lines 14. One comprise to get around this non-gap filling problem is to reduce the thickness of the barrier layer 16. However, if the barrier layer 16 thickness is reduced too much, the metal lines 14 can be damaged by subsequent plasma etch back processes.

Another problem with current SOG processes is the poison via problem where SOG 118 is left exposed in the vias over the metal lines 14. This can be caused by an improper partial SOG etchback where SOG is left in the via area. Many sidewall via spacers processes have been proposed, but these add process complexity and cost to the product. Moreover, to eliminate the poison via problem, it has been suggested to replace the spin-on-glass layer other layers formed of other materials, such as silicon oxide deposited by high density plasma (HDP) chemical vapor deposition (CVD). However, SOG has a lower dielectric constant than these other materials which reduces RC delay times for sub 0.35 μm products. SOG has a dielectric constant of about 3 compared the PE-oxide dielectric constant of about 4.

Compared to the conventional SOG processes, the invention has the following key features:
A key feature of the invention is the novel 1st SOG layer 18 that has reflow properties so that the SOG fills gaps between metal lines >0.15 μm. No 1st SOG layer 18 remains above the metal lines 15 after reflow. See FIG. 1.
The Invention's 1st SOG layer 18 is a new use specifically for Allied Signal Accuspin 418 SOP and HSG-2209S-R7 organic spin-on-glasses.
The first 18 and second SOG layers have different coating functions and properties. The first SOG layer fills in between the metal lines, and does not remain on top of the metal lines. The second SOG layer does not have the reflow property. The second SOG layer is a sacrificial layer for etch back planarization.
The second SOG layer 28 is removed in an etched back to planarized the underlying $SiO_2$ layer 24.

It should be will understood by one skilled in the art that by including additional process step not described in this embodiment, other types of devices can also be included on the substrate.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an interlevel dielectric layer for a semiconductor device, comprising the steps of:
   a) forming spaced conductive lines over a semiconductor structure including a substrate;
   b) forming a barrier layer over said spaced conductive lines and over said semiconductor structure; said spaced conductive lines covered with said barrier layer having gaps therebetween;
   c) forming a first spin-on-glass layer on said barrier layer; said first spin-on-glass layer having the property to fill said gaps after a reflow step;
   d) reflowing said first spin-on-glass layer; all said first spin-on-glass layer flowing from over said conductive lines and flowing into said gaps; no said first spin-on-glass layer remains over said conductive lines;
   e) depositing a silicon oxide layer using a PECVD process over said barrier and on said first spin-on-glass layer in said gaps;
   f) forming a second spin-on-glass layer on said silicon oxide layer; and
   g) performing an etchback by etching back and removing all of said second spin on glass layer and portions said silicon oxide layer.

2. The method of claim 1 wherein said barrier layer is formed by a PECVD-SiH$_4$ process and has a thickness in a range of between about 500 and 2000 Å.

3. The method of claim 1 wherein said first spin on glass layer is composed of methylsilsesquioxane polymer based spin-on-glass.

4. The method of claim 1 wherein said first spin-on-glass is reflowed at temperature in a range of about 400 and 450° C. for a time in a range of about 10 and 200 minutes.

5. The method of claim 1 wherein the forming of said first spin-on-glass layer included dispensing a first spin-on-glass solute of Allied Signal type 218 spin-on-glass and spinning said first spin-on-glass solute at a speed in a range of about 1000 and 5000 rpm for a time in a range of about 0.5 and 3 min, and curing said first spin-on-glass solute at a temp in a range of about 400 and 450 C° for a time in a range of about 10 and 200 min, and said first spin-on-glass layer having a thickness in a range of between about 1000 and 3000 Å.

6. The method of claim 1 wherein said silicon oxide layer is formed using a PECVD-SiH4 process and said silicon oxide layer having a thickness in a range of between about 3000 and 10,000 Å.

7. The method of claim 1 wherein said second spin on-glass layer formed using Allied signal type 211 SOG, and said second spin on glass having a thickness in a range of between about 3000 and 10,000 Å.

8. The method of claim 1 wherein said second spin-on-glass layer is cured at temperature in a range of about 400 and 450° C. for a time in a range of about 10 and 40 minutes.

9. The method of claim 1 wherein said etchback removes a total thickness of second spin-on-glass layer and said second oxide layer in a range of about 3000 and 7000 Å and said etchback is a dry etch process.

10. The method of claim 1 which further includes forming an insulating cap layer over said silicon oxide layer, said insulating cap layer formed of a material selected from the group consisting of: silicon oxide and silicon nitride; and said insulating cap layer has a thickness in a range of between about 1000 and 5000 Å.

11. A method of manufacturing an interlevel dielectric layer for a semiconductor device, comprising the steps of:
   a) forming a spaced conductive lines over a semiconductor structure including a substrate;
   b) forming a barrier layer composed of silicon oxide over said spaced conductive lines and over said semiconductor structure; said spaced conductive lines covered with said barrier layer having gaps therebetween; said barrier layer does not fill or close said gaps between said spaced conductive lines; said gap having a minimum width between 0.1 and 0.5 µm;
   c) forming a first spin-on-glass layer on said barrier layer; said first spin-on-glass having a property of filling gap 0.10 µm width and larger after a reflow process;
   d) reflowing said first spin-on-glass layer at temperature in a range of about 400 and 450° C. for a time in a range of about 20 and 40 minutes; and all said first spin-on-glass layer reflowing from over said conductive lines and reflowing into said gaps; no said first spin-on-glass layer remains over said conductive lines;
   e) depositing a silicon oxide layer using a PECVD process over said barrier layer and on said first spin-on-glass layer in said gaps; forming a second spin-on-glass layer on said silicon oxide layer; curing said second spin-on-glass layer at temperature in a range of about 400 and 450° C. for a time in a range of about 10 and 60 minutes;
   f) performing a etchback by RIE etch back and removing all of said second spin on glass layer and portions said silicon oxide layer; and
   g) forming an insulating cap layer on said silicon oxide layer; said insulating cap layer formed of a material selected from the group consisting of: silicon oxide and silicon nitride.

12. The method of claim 11 wherein said barrier layer having a thickness in a range of between about 500 and 2000 Å.

13. The method of claim 11 wherein said silicon oxide layer having a thickness in a range of between about 3000 and 10,000 Å.

14. The method of claim 11 wherein said second spin on glass having a thickness in a range of between about 1000 and 3000 Å.

15. The method of claim 11 wherein said etchback removing a total thickness of between about 3000 and 7000 Å of said second spin on glass layer and said silicon oxide layer.

16. A method of manufacturing an interlevel dielectric layer for a semiconductor device, comprising the steps of:
   a) forming a spaced conductive lines over a semiconductor structure including a substrate;
   b) forming a barrier layer by PECVD-SiH4 over said spaced conductive lines and over said semiconductor structure; said spaced conductive lines covered with said barrier layer having gaps therebetween; said barrier layer having a thickness in a range of between about 500 and 2000 Å, said barrier layer does not fill or close said gaps between said spaced conductive lines; said gap having a minimum width between 0.1 and 0.35 µm;
   c) forming a first spin-on-glass layer on said barrier layer; said first spin of glass composed a methylsilsesquioxane based spin-on-glass; said first spin-on-glass having a property of reflowing from over said conductive lines into gaps thereby filling gap 0.10 μm widths and larger after a reflow process;

d) reflowing said first spin-on-glass layer at temperature in a range of about 400 and 450° C. for a time in a range of about 20 and 40 minutes; and all said first spin-on-glass layer reflowing from over said conductive lines and reflowing into said gaps;

e) depositing a silicon oxide layer using a PECVD-SiH$_4$ process over said barrier layer and on said first spin-on-glass layer in said gaps; said silicon oxide layer having a thickness in a range of between about 3000 and 10,000 Å;

f) forming a second spin-on-glass layer on said silicon oxide layer; said second spin on glass having a thickness in a range of between about 1000 and 3000 Å;

g) curing said second spin-on-glass layer at temperature in a range of about 400 and 450° C. for a time in a range of about 10 and 60 minutes;

h) performing a second etchback by RIE etching back and removing said second spin on glass layer and portions said silicon oxide layer to remove a total thickness of between about 3000 and 7000 Å;

i) forming an insulating cap layer on said silicon oxide layer; said insulating cap layer formed of a material selected from the group consisting of: silicon oxide and silicon nitride.

17. The method of claim 1 wherein said gaps have a minimum width between 0.1 um and 0.35 μm.

18. The method of claim 1 wherein said gaps have a minimum width between 0.1 um and 0.15 μm.

19. The method of claim 11 wherein said gaps have a minimum width between 0.1 um and 0.15 μm.

* * * * *

UNITED STATES PATENT AND TRADEMARK OFFICE
CERTIFICATE OF CORRECTION

PATENT NO. : 6,239,034 B1
DATED : May 29, 2001
INVENTOR(S) : Fu-Liang Yang, Liang-Tung Chang It is certified that error appears in the above-identified patent and that said Letters Patent is hereby corrected as shown below:

Title page,
Item [74], please delete "William J. Staffel" and replace with -- William J. Stoffel --.

Signed and Sealed this

Twenty-seventh Day of November, 2001

*Attest:*

NICHOLAS P. GODICI
*Acting Director of the United States Patent and Trademark Office*

*Attesting Officer*